United States Patent [19]

Ryon

[11] 4,310,804
[45] Jan. 12, 1982

[54] INPUT ACTIVATED FREQUENCY SYNTHESIZER

[75] Inventor: Donald C. Ryon, Carol Stream, Ill.

[73] Assignee: Motorola, Inc., Schaumburg, Ill.

[21] Appl. No.: 36,130

[22] Filed: May 4, 1979

Related U.S. Application Data

[63] Continuation of Ser. No. 875,251, Feb. 6, 1978, abandoned.

[51] Int. Cl.³ .................... H03L 7/14; H03L 7/16
[52] U.S. Cl. ........................ 331/1 A; 84/1.22;
331/14; 331/17; 331/25; 331/76
[58] Field of Search .......... 331/1 A, 14, 17, 18,
331/25, 76; 84/1.01, 1.19, 1.22, 1.23

[56] References Cited

U.S. PATENT DOCUMENTS

| 3,573,649 | 4/1971 | West | 331/17 X |
| 3,702,370 | 11/1972 | Hallman, Jr. | 84/1.22 X |
| 4,061,979 | 12/1977 | Walker et al. | 331/17 X |

*Primary Examiner*—Siegfried H. Grimm
*Attorney, Agent, or Firm*—James W. Gillman; Edward M. Roney; Margaret M. Parker

[57] ABSTRACT

A frequency synthesizer is controlled by the frequency of an input signal. The input signal is sampled and, either during or at the end of the input signal, the output signal is locked on the frequency of the input signal. Octavely related harmonics are combined to provide tone color.

2 Claims, 3 Drawing Figures

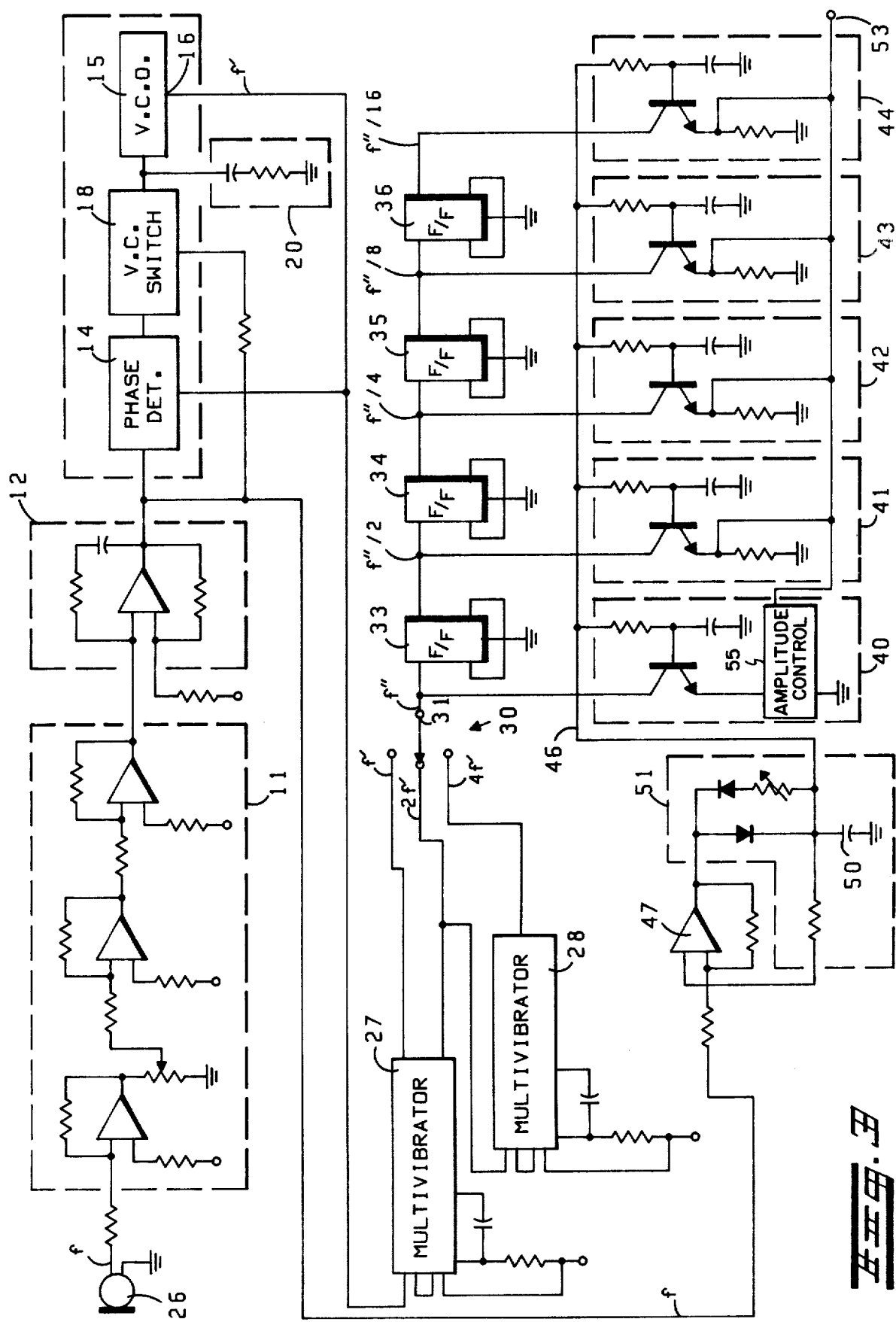

INPUT ACTIVATED FREQUENCY SYNTHESIZER

This is a continuation of application Ser. No. 875,251, filed Feb. 6, 1978 and now abandoned.

BACKGROUND OF THE INVENTION

This invention relates to the field of frequency synthesizers and more particularly to synthesizers which can sample and hold a received frequency.

Synthesizers which can provide an output signal of a desired frequency and harmonic content are well known in the art. It may, however, be desirable to let a brief input signal determine the frequency of a sustained synthesizer output signal. The input signal might be an audio frequency signal as from a microphone. In the field of musical instruments it may also be necessary to measure very accurately an audio signal, such as from one of the percussion instruments, which is produced for only a brief period and which, during that period, may change rapidly in amplitude and/or frequency. If such a signal could be sustained for a substantial period, accurate measurement of the frequency becomes possible. In RF circuitry, it may also be desirable to sample a brief RF signal and lock an oscillator onto that frequency for a substantial period of time.

SUMMARY OF THE INVENTION

It is therefore an object of the present invention to provide a circuit which will lock onto and sustain the frequency of an input signal.

It is a particular object to provide a frequency synthesizer circuit which can lock on at either the final frequency of the received input signal or the instantaneous frequency at the end of any chosen time interval.

These objects and others are provided in a circuit in accordance with the present invention and including a phase detector, a voltage controlled oscillator with output frequency controllable by an output signal from the phase detector, a switching circuit for coupling the output of the phase detector to the voltage controlled oscillator in response to an input signal, and a memory circuit including a charging circuit which is charged by the output of the phase detector. In the absence of an input signal, the memory circuit controls the output frequency of the voltage controlled oscillator. In addition, a second switching circuit may be included for coupling the output signal of the voltage controlled oscillator to the circuit output, and a timing circuit may close the first switching circuit for a brief sampling period, then open the first switching circuit and close the second for a substantially longer period.

BRIEF DESCRIPTION OF THE DRAWING

FIG. 3 is a logic diagram of a synthesizer circuit including the circuit of FIG. 1.

DETAILED DESCRIPTION OF A PREFERRED EMBODIMENT

The present invention comprises a circuit for producing a sustained output signal having the frequency of an applied input signal which may have a very brief duration. This circuit is described herein in relation to audio frequency signals, and as applied to a frequency synthesizer, but it is in no way limited thereto. In fact, the circuit is applicable as well to RF circuitry with appropriate component value changes.

Figure 1:
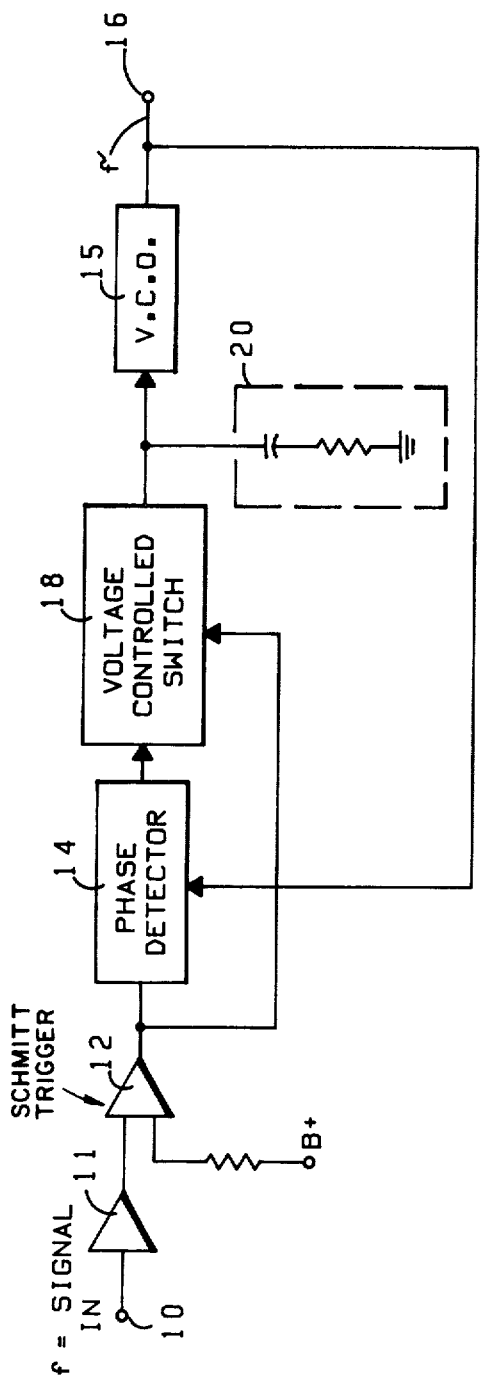
FIG. 1 is a block diagram of the basic sample-and-hold circuit in accordance with the invention.

The invention will be best understood with reference to the figures of the drawing in which like parts are denoted by like reference numerals throughout. FIG. 1 shows the basic circuit for sampling the fundamental frequency "f" of an input signal and locking an oscillator on that frequency, even after the input signal has ceased. The signal f may be received at a terminal 10 from any source (not shown); e.g., a microphone. This signal may be amplified in any desired number of amplifier stages, represented by the amplifier 11. The signal is then coupled to a Schmitt trigger 12, which functions as a zero crossing detector. The output of the Schmitt trigger 12 is thus a squarewave signal at the frequency f of the fundamental of the input signal at terminal 10. A phase detector 14 and a voltage controlled oscillator (VCO) 15 functions as a phase locked loop, i.e., the phase detector 14 receives two inputs, one from the Schmitt trigger 12 and one from an output 16 of the VCO, and provides an output signal to the VCO which will bring the output frequency f' of the VCO into agreement with the output frequency f of the Schmitt trigger 12. A voltage controlled switch 18 is coupled between the phase detector 14 and VCO 15, with a memory circuit 20 also coupled to the input of the VCO. The voltage controlled switch 18 is controlled in response to an input signal, preferably by the output of the Schmitt trigger 12. When a signal is being received at the terminal 10 and the Schmitt trigger 12 has an output signal, the voltage controlled switch 18 couples the output signal of the phase detector 14 to the VCO 15 and also to the memory circuit 20. The memory circuit 20 includes a charging circuit and could be as simple as the capacitor-resistor combination shown in FIG. 1, or it could be a more complex arrangement. Its function is to "remember" the output voltage required to keep the VCO on the desired frequency (f'=f). The component values and time constant of the memory circuit 20 depend on the desired frequency range and how long it is desirable to maintain the sampled frequency at the output 16.

Figure 2:
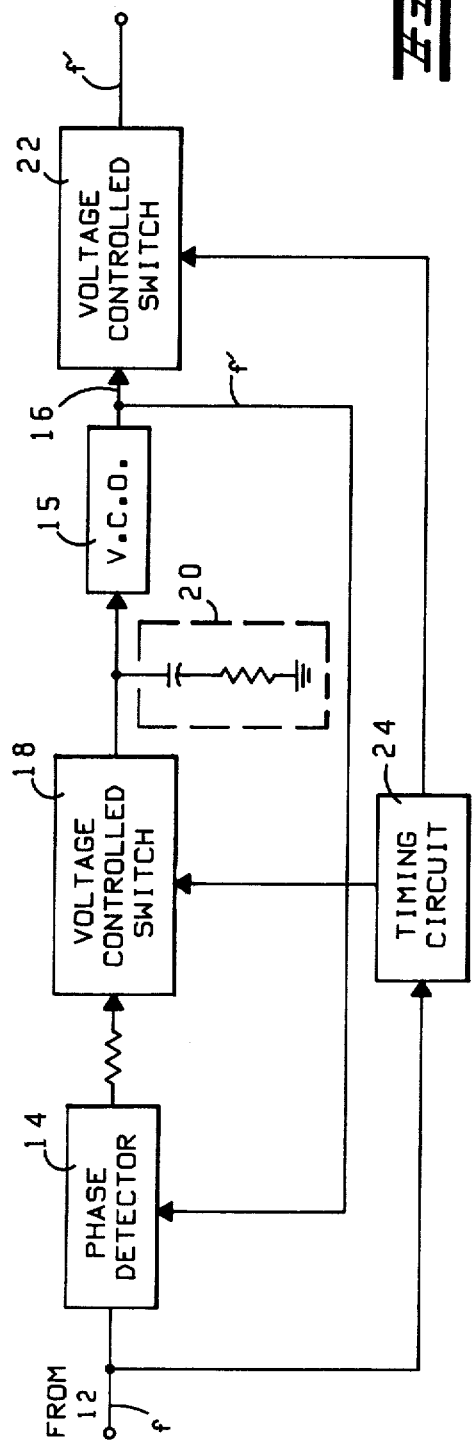
FIG. 2 is a block diagram of a circuit similar to that of FIG. 1, with added features.

The diagram in FIG. 2 contains most of the parts shown in FIG. 1, functioning the same in most respects. A second voltage controlled switch 22 is coupled to the output of the VCO 15. A timing circuit 24 has an input from the Schmitt trigger 12 and has separate outputs to the voltage controlled switches 18 and 22. Since, in many applications, it may be desirable to sample the instantaneous frequency f of the input signal at some predetermined interval of time after initialization, rather than the last detectable frequency received, the timing circuit can cause the voltage controlled switch 18 to open at the end of that predetermined interval, allowing the memory circuit 20 to assume control of the VCO output. The voltage controlled switch 22 could, if desired, be closed only after the end of the sampling interval and could be opened after another and longer "hold" interval. In an application of the circuit such as in tuning a musical instrument, the "sampling" interval might be of the order of 100 msec and the "hold" interval might be five seconds.

In FIG. 3 a frequency synthesizer is shown including the circuit of FIG. 1 and with a microphone 26 as the source of the input signal f at point 10. The signal f' at point 16, as in FIG. 1, is of the same frequency as the fundamental of the signal at point 10 (f'=f). The point 16 couples to both the inputs of a first monostable multivibrator 27, thus the multivibrator is triggered on each half cycle of the signal on point 16 and the input frequency is multiplied by a factor of two. The output of the multivibrator 27 is coupled to the input of another monostable multivibrator 28, providing another multiplication by two. The multivibrators 27 and 28 may be embodied by an integrated circuit such as the Motorola MC14528. A single, three position switch 30 is coupled to the monostable multivibrators 27 and 28 to provide a choice of frequencies (f'' is f', 2f' or 4f') at its output point 31. The output signal f'' on point 31 is coupled to a series of flip-flops 33, 34, 35 and 36 which divide f'' by 2, 4, 8 and 16, respectively. The signal f'' and each of the flip-flop outputs are coupled individually to keyed transistor circuits 40, 41, 42, 43 and 44 respectively. The keyed transistor circuits 40–44 are controlled by a common keying voltage on a point 46. The keying voltage is provided by another Schmitt trigger circuit 47 having the output of the Schmitt trigger 12 at its input. When the output of the Schmitt trigger 47 is driven high by the output of the Schmitt trigger 12, a capacitor 50 in a delay circuit 51 is charged. When the input signal to the Schmitt trigger 47 goes to zero, the capacitor 50 begins to discharge, and the outputs of the keyed transistor circuits 40-44 are reduced accordingly. The transistor circuit outputs can be coupled directly to a single bus 53 or each output signal could be amplitude controlled as by controls 55 (one shown) before addition as desired to provide a chosen tone color. The envelope of the signal on the bus 53 and its harmonic content are thus a function of the input signal f and the octavely-related outputs of the keyed transistor circuits 40-44.

As disclosed hereinabove, circuitry has been provided wherein an input signal frequency can control the frequency of an output signal for a significant period of time after the end of the input signal. The sustained output signal can then be utilized for measurement of the fundamental frequency of the input signal or in a frequency synthesizer which can provide any desired tone color based on the frequency of the input signal. Other variations and modifications are possible and it is intended to cover all such as fall within the spirit and scope of the appended claims.

What is claimed is:

1. A phase locked loop with memory control and comprising in combination:
   input means for receiving a signal;
   phase detector means having a first input coupled to the input means;
   voltage controlled oscillator means having an output signal which is frequency controllable by an output voltage signal from the phase detector means, the output signal of the oscillator means being coupled to a second input of the phase detector means;
   switching means for coupling the output voltage signal of the phase detector means to the oscillator means in response to a received signal;
   memory circuit means coupled to the input of the oscillator means and including charging means for being charged by the output voltage signal of the phase detector means, the memory circuit means controlling the output signal frequency of the oscillator means in the absence of a received signal at the input means;
   timing means responsive to the received signal for activating the switching means to decouple the output signal of the phase detector means from the oscillator means a predetermined period of time after each initial signal reception; and
   second switching means for coupling the output signal of the oscillator means to an output means and wherein the timing means activates the second switching means for a second predetermined time interval, the second time interval being subsequent to and substantially longer than the first time interval.

2. A frequency synthesizer activated by an input signal and comprising in combination:
   input means for receiving a signal;
   phase detector means having a first input coupled to the input means;
   voltage controlled oscillator neans having an output signal which is frequency controllable by an output voltage signal from the phase detector means, the output signal of the oscillator means being coupled to a second input of the phase detector means;
   switching means for coupling the output voltage signal of the phase detector means to the oscillator means in response to a received signal;
   memory circuit means coupled to the input of the oscillator means and including charging means for being charged by the output voltage signal of the phase detector means, the memory circuit means controlling the output signal frequency of the oscillator means in the absence of a received signal at the input means;
   a multiplicity of circuit means for receiving the output signal from the voltage controlled oscillator means and providing therefrom signals which are selected multiples of the frequency of said output signal, said multiples being selected from a group including both integral and fractional multiples thereof;
   control means coupled to at least one of the multiplicity of circuit means for controlling the amplitude of the output signal thereof; and
   adder means for combining the selected and controlled multiple signals into a common output signal whereby desired tone colors are provided.

* * * * *